(12) United States Patent
Ishido (10) Patent No.: US 11,314,181 B2
(45) Date of Patent: Apr. 26, 2022

(54) IMAGE FORMING DEVICE

(71) Applicant: KYOCERA Document Solutions Inc., Osaka (JP)

(72) Inventor: Kohei Ishido, Osaka (JP)

(73) Assignee: KYOCERA DOCUMENT SOLUTIONS INC., Osaka (JP)

(*) Notice: Subject to any disclaimer, the term of this patent is extended or adjusted under 35 U.S.C. 154(b) by 14 days.

(21) Appl. No.: 17/126,113

(22) Filed: Dec. 18, 2020

(65) Prior Publication Data

US 2021/0191288 A1 Jun. 24, 2021

(30) Foreign Application Priority Data

Dec. 23, 2019 (JP) .............................. JP2019-231804

(51) Int. Cl.
*G03G 15/02* (2006.01)
*G03G 15/00* (2006.01)
*H03L 7/07* (2006.01)

(52) U.S. Cl.
CPC ......... *G03G 15/0266* (2013.01); *G03G 15/80* (2013.01); *H03L 7/07* (2013.01)

(58) Field of Classification Search
USPC .......................................................... 399/50
See application file for complete search history.

(56) References Cited

FOREIGN PATENT DOCUMENTS

| JP | H06-130749 | 5/1994 | |
| JP | 4008202 B2 * | 11/2007 | ......... G03G 15/0266 |

* cited by examiner

*Primary Examiner* — Quana Grainger
(74) *Attorney, Agent, or Firm* — Lex IP Meister, PLLC

(57) ABSTRACT

An image forming device includes a first control circuit, a second control circuit, a high-voltage substrate, and a polygon motor. The high-voltage substrate applies a voltage with a frequency of an application signal to a toner image forming member. The first control circuit generates a first clock signal, counts the number of the first clock signal, and generates a motor drive signal. The first control circuit counts the first clock signal and generates an adjustment signal. The second control circuit counts the number of actual measurements which is a count value of the second clock signal during one cycle of the adjustment signal. The second control circuit counts the second clock signal by a set value. A setting circuit in the second control circuit sets the set value in accordance with the difference between the number of actual measurements and a theoretical number of times.

7 Claims, 4 Drawing Sheets

| ACTUAL MEASUREMENT RESULT | FIRST SET VALUE | SECOND SET VALUE |
|---|---|---|
| NUMBER OF ACTUAL MEASUREMENTS = THEORETICAL NUMBER OF TIMES | FIRST SET VALUE = CHARGING REFERENCE VALUE | SECOND SET VALUE = DEVELOPING REFERENCE VALUE |
| NUMBER OF ACTUAL MEASUREMENTS > THEORETICAL NUMBER OF TIMES | FIRST SET VALUE > CHARGING REFERENCE VALUE | SECOND SET VALUE > DEVELOPING REFERENCE VALUE |
| NUMBER OF ACTUAL MEASUREMENTS < THEORETICAL NUMBER OF TIMES | FIRST SET VALUE < CHARGING REFERENCE VALUE | SECOND SET VALUE < DEVELOPING REFERENCE VALUE |

FIRST SET VALUE = ESTIMATED VALUE / X
X = IDEAL FREQUENCY OF CHARGING SIGNAL
SECOND SET VALUE = ESTIMATED VALUE / Y
Y = IDEAL FREQUENCY OF DEVELOPING SIGNAL
* ESTIMATED VALUE (FREQUENCY OF SECOND CLOCK SIGNAL) = NUMBER OF ACTUAL MEASUREMENTS × IDEAL FREQUENCY OF ADJUSTMENT SIGNAL

IMAGE FORMING DEVICE

INCORPORATION BY REFERENCE

This application is based upon, and claims the benefit of priority from, corresponding Japanese Patent Application No. 2019-231804 filed in the Japan Patent Office on Dec. 23, 2019, the entire contents of which are incorporated herein by reference.

BACKGROUND

Field of the Invention

The present disclosure relates to an image forming device that prints using toner.

Description of Related Art

An image forming device, such as a multifunction peripheral, a printer, and a facsimile device, is known. The image forming device includes a circuit that generates a signal (clock signal) for operation. Typically, there has been known an image forming device that generates a signal with a predetermined frequency, and distributes the signal with the predetermined frequency to each unit in the image forming device.

SUMMARY

An image forming device according to the present disclosure includes a first control circuit, a second control circuit, a high-voltage substrate, and a polygon motor. The high-voltage substrate receives an application signal output from the second control circuit. The high-voltage substrate applies a voltage with a frequency of the application signal which has been input to a toner image forming member. The first control circuit includes a first oscillation unit, a drive signal generation circuit, and an adjustment signal generation circuit. The first oscillation unit generates a first clock signal by using a first oscillator. The drive signal generation circuit counts the number of the first clock signals, which have been input. The drive signal generation circuit generates a motor drive signal. The drive signal generation circuit sets an interval for counting the first clock signal by a first number of times as one cycle of the motor drive signal. The drive signal generation circuit inputs the motor drive signal to the polygon motor to rotate the polygon motor. The adjustment signal generation circuit counts the number of the first clock signal, which have been input. The adjustment signal generation circuit generates an adjustment signal. The adjustment signal generation circuit sets an interval for counting the first clock signal by a second number of times as one cycle of the adjustment signal. The second control circuit includes a second oscillation unit, an adjustment signal capture circuit, an application signal generation circuit, and a setting circuit. The second oscillation unit generates a second clock signal by using a second oscillator. The adjustment signal capture circuit counts the number of actual measurements, which is a count value of the second clock signal during one cycle of the adjustment signal which has been input. The application signal generation circuit counts the number of the second clock signal, which have been input. The application signal generation circuit sets an interval for counting the second clock signal by a set value as one cycle of the application signal. The setting circuit compares the number of actual measurements with a predetermined theoretical number of times for the number of actual measurements. The setting circuit sets the set value in accordance with a difference between the number of actual measurements and the theoretical number of times. The theoretical number of times is a number obtained by dividing an ideal frequency of the second clock signal by an ideal frequency of the adjustment signal.

DETAILED DESCRIPTION

Hereinafter, embodiments of the present disclosure will be described with reference to FIGS. 1 to 4. In the following description, a printer 100 will be described as an example of an image forming device. Note that each element such as the configuration and arrangement described in the present embodiment does not limit the scope of disclosure, and is merely an explanatory example. In the following description, an example in which toner with a positively charged type is used will be described. However, the present disclosure can also be applied to an image forming device using toner with a negatively charged type.

(Outline of Printer 100)

Figure 1:
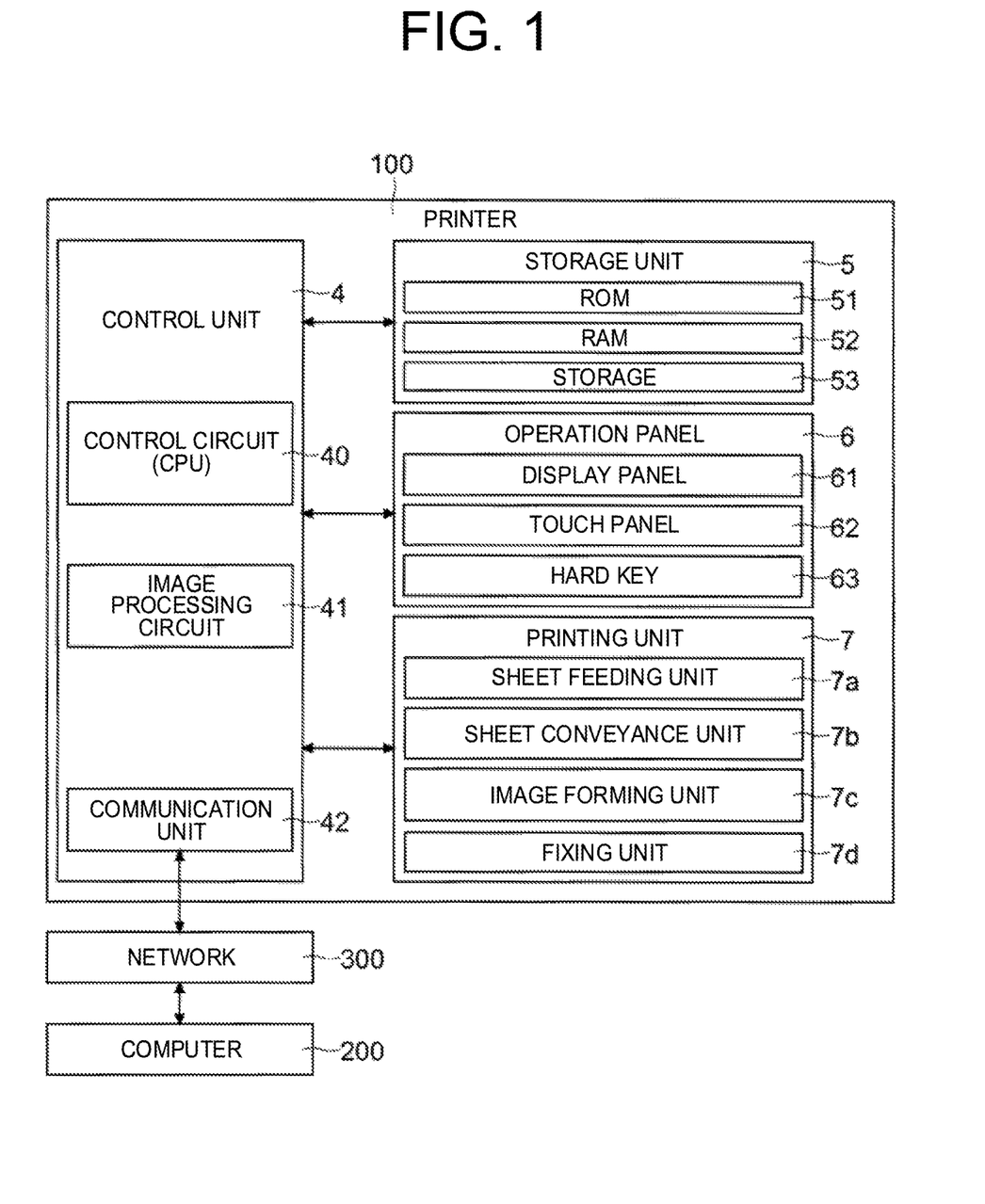
FIG. 1 is a diagram illustrating an example of a printer according to an embodiment.

Next, the outline of the printer 100 according to an embodiment will be described with reference to FIG. 1. FIG. 1 is a diagram illustrating an example of the printer 100 according to the embodiment.

The printer 100 includes a first control circuit 1, a second control circuit 2, and a high-voltage substrate 3 (see FIG. 3, the details will be described later). Further, a control unit 4 (control board) is provided in the printer 100. The control unit 4 controls the operation of the printer 100. The control unit 4 includes a control circuit 40, an image processing circuit 41, and a communication unit 42. For example, the control circuit 40 is a central processing unit (CPU). The control circuit 40 controls the operation of each unit in the printer 100, based on a program and data stored in a storage unit 5. The control circuit 40 performs calculation and processing on the basis of the program and the data in the storage unit 5.

The communication unit 42 includes a socket, a communication circuit, and a memory for communication. The communication unit 42 communicates with a computer 200 via a network 300. The communication circuit performs processing related to the communication. The memory for communication stores software for the communication. The type of the network 300 is, for example, a local area network (LAN). The computer 200 is, for example, a personal computer (PC) or a server. The communication unit 42 receives print data transmitted from the computer 200. The print data includes setting data for printing and data in which print contents are described in a page description language.

The image processing circuit 41 is, for example, an application specific integrated circuit (ASIC), which is an integrated circuit designed for image processing. The image processing circuit 41 generates image data (raster data) based on data described in the page description language, which is included in the print data. The image processing circuit 41 performs image processing on the generated image data to generate image data for output. The image processing circuit 41 performs image processing in accordance with the setting content (setting data) for printing performed by the computer 200.

The storage unit 5 includes a read only memory (ROM) 51, a random access memory (RAM) 52, and a storage 53. The storage 53 is, for example, a hard disk drive (HDD) or a solid state drive (SSD). The storage unit 5 is a combination of a nonvolatile storage device and a volatile storage device.

The printer 100 includes an operation panel 6. The operation panel 6 includes a display panel 61, a touch panel 62, and a hard key 63. The control unit 4 causes the display panel 61 to display a message, a setting screen, and a software key. Further, the control unit 4 recognizes the operated software key based on the output of the touch panel 62. Furthermore, the control unit 4 recognizes the operated hard key 63 based on a signal output by the hard key 63.

The printer 100 includes a printing unit 7. The printing unit 7 includes a sheet feeding unit 7a, a sheet conveyance unit 7b, an image forming unit 7c, and a fixing unit 7d. The control unit 4 controls the operations of the sheet feeding unit 7a, the sheet conveyance unit 7b, the image forming unit 7c, and the fixing unit 7d. The details of the printing unit 7 will be described later.

(Printing Unit 7)

Figure 2:
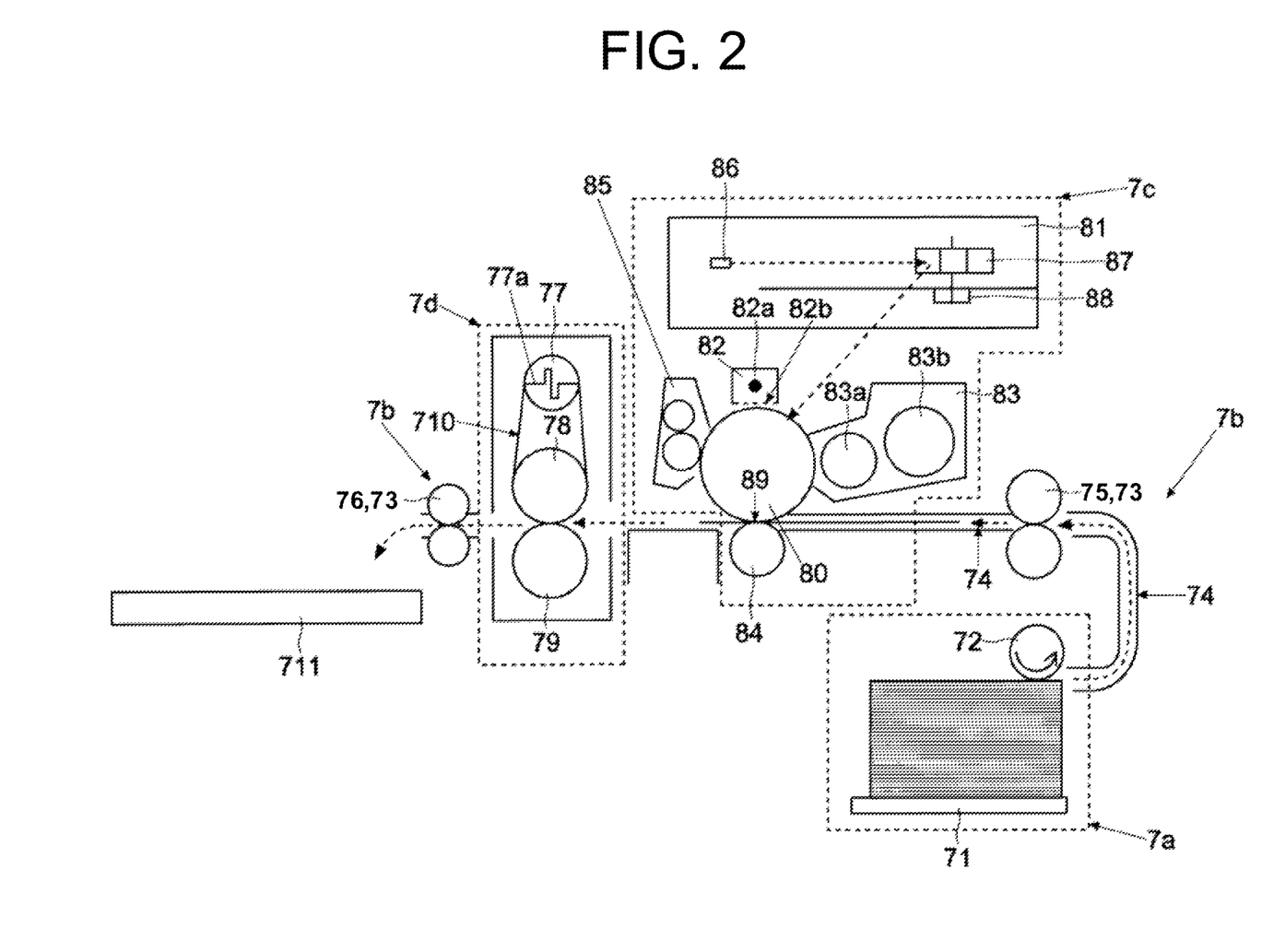
FIG. 2 is a diagram illustrating an example of a printing unit according to the embodiment.

Next, an example of the printing unit 7 according to the embodiment will be described with reference to FIG. 2. FIG. 2 is a diagram illustrating an example of the printing unit 7 according to the embodiment.

The sheet feeding unit 7a includes, for example, a sheet setting plate 71, a sheet feeding roller 72, and a sheet feeding motor (not illustrated). A sheet bundle is set on the sheet setting plate 71. The sheet feeding motor rotates the sheet feeding roller 72. At the time of a print job, the control unit 4 rotates the sheet feeding roller 72 (the sheet feeding motor). The sheet feeding roller 72 rotates to feed the sheets, which are set on the sheet setting plate 71, one by one. The sheet is fed to the sheet conveyance unit 7b.

The sheet conveyance unit 7b includes a pair of conveyance rollers 73, a conveyance guide 74, and a conveyance motor (not illustrated) for conveying a sheet. The conveyance motor rotates the pair of conveyance rollers 73. Accordingly, the pair of conveyance rollers 73 conveys a sheet. FIG. 2 illustrates an example in which a pair of registration rollers 75 and a pair of discharge rollers 76 are provided as the pair of conveyance rollers 73.

The control unit 4 has stopped the pair of registration rollers 75 when the front end of a sheet reaches. The skew of the sheet is corrected by abutting the front end of the sheet against the nip of the pair of registration rollers 75. After the correction, the control unit 4 rotates the pair of registration rollers 75 in accordance with the toner image formed by the image forming unit 7c (photosensitive drum 80). Accordingly, the sheet is fed from the pair of the registration rollers 75 so that the toner image is transferred to the appropriate position on the sheet. The conveyance guide 74 guides a sheet to be conveyed. Accordingly, the sheet is conveyed on a predetermined path.

The image forming unit 7c includes a photosensitive drum 80, an exposure device 81, a charging device 82, a developing device 83, a transfer roller 84, and a cleaning device 85. The charging device 82, the developing device 83, the transfer roller 84, and the cleaning device 85 are provided around the photosensitive drum 80. The charging device 82, the developing device 83, the transfer roller 84, and the cleaning device 85 are provided in this order from the upstream side of the photosensitive drum 80 in the rotation direction.

The photosensitive drum 80 has a cylindrical shape. A surface (circumferential surface) of the photosensitive drum 80 is a photosensitive layer. The photosensitive layer is, for example, a layer of amorphous silicon. At the time of printing, the control unit 4 rotates a main motor (not illustrated) that rotates the photosensitive drum 80. At the time of printing, the control unit 4 rotates the photosensitive drum 80 at a predetermined peripheral speed.

The charging device 82 charges the surface of the photosensitive drum 80. The charging device 82 is, for example, a scorotron type charging device. The charging device 82 includes a charging member 82a (corresponding to a toner image forming member). In the example of FIG. 2, the charging member 82a is a discharge wire. The discharge wire emits a positive charge. The lower surface of the charging device 82 (the surface opposed to the photosensitive drum 80) is a mesh member 82b. The portion of the photosensitive drum 80 facing the mesh member 82b is referred to as a grid. The grid is positively charged. Note that, as the charging member 82a, the charging device 82 using a roller or a brush may be used.

The exposure device 81 includes a semiconductor laser device 86 (laser diode). The exposure device 81 turns on and off the semiconductor laser device 86, based on image data for output. The exposure device 81 includes a polygon mirror 87 and a polygon motor 88. The polygon mirror 87 has a polygonal prism shape. The polygon mirror 87 reflects laser light from the semiconductor laser device 86 toward the photosensitive drum 80. The polygon motor 88 rotates the polygon mirror 87. The polygon mirror 87 rotates so that the irradiation position of the laser light on the photosensitive drum 80 moves at a constant speed along the main scanning direction. The photosensitive drum 80 is scanned and exposed by the irradiation with the laser light (optical signal) from the exposure device 81. In the photosensitive drum 80, the positive charge is canceled in the portion (pixel) irradiated with the laser light. As a result, an electrostatic latent image corresponding to the image data for output is formed on the circumferential surface of the photosensitive drum 80.

The developing device 83 accommodates toner therein. The developing device 83 includes a developing roller 83a (corresponding to the toner image forming member) and a stirring roller 83b. At the time of printing, the developing roller 83a and the stirring roller 83b rotate. For example, the main motor rotates the developing roller 83a and the stirring roller 83b. At the time of printing, the control unit 4 rotates the main motor.

The stirring roller 83b has a blade for stirring the toner. The toner is stirred by the rotation of the stirring roller 83b. The toner is positively charged by the friction caused by the stirring. Note that the printer 100 includes a replenishment device (not illustrated). When the toner in the developing device 83 is reduced by printing, the replenishment device replenishes toner to the developing device 83.

The circumferential surface of the developing roller 83a faces the circumferential surface of the photosensitive drum 80. The rotation axis of the developing roller 83a is parallel to the rotation axis of the photosensitive drum 80. A gap is provided between the developing roller 83a and the photosensitive drum 80. The gap is minute. For example, the gap is 1 (one) mm or less. The developing roller 83a carries toner on the circumferential surface thereof. The toner adheres to a portion (pixel) of the circumferential surface of the photosensitive drum 80 where the positive charge is canceled by the exposure. An electrostatic latent image on the circumferential surface of the photosensitive drum 80 is developed with the toner carried by the developing roller 83*a*. The photosensitive drum 80 rotates while carrying a toner image developed with the toner supplied from the developing roller 83*a*.

The circumferential surface of the transfer roller 84 faces the circumferential surface of the photosensitive drum 80. The rotation axis of the transfer roller 84 is parallel to the rotation axis of the photosensitive drum 80. The transfer roller 84 is in contact with the photosensitive drum 80. The contact portion serves as a transfer nip 89. At the time of printing, the photosensitive drum 80 and the transfer roller 84 rotate. A sheet passes through the transfer nip 89. At the time of this passage, the toner image is transferred from the photosensitive drum 80 to the sheet. As illustrated in FIG. 2, the photosensitive drum 80 and the transfer roller 84 are in contact with each other in the up-down direction. The sheet passes through the transfer nip 89 in the horizontal direction.

The cleaning device 85 collects the toner remaining on the surface of the photosensitive drum 80 after the transfer. The cleaning device 85 cleans the surface of the photosensitive drum 80.

The fixing unit 7*d* is provided on the downstream side of the image forming unit 7*c* in the sheet conveyance direction. The fixing unit 7*d* includes a rotating body for fixing. The rotating body for fixing includes a first heating roller 77, a second heating roller 78, and a pressure roller 79. A heating belt 710 is stretched around the first heating roller 77 and the second heating roller 78. The first heating roller 77 has a built-in heater 77*a*. The heater 77*a* is an induction heating (IH) heater, for example. The second heating roller 78 and the pressure roller 79 sandwich the heating belt 710 therebetween. The sheet on which a toner image is transferred passes between the outer circumferential surface of the heating belt 710 and the pressure roller 79. As a result of heating and pressurizing the sheet, the toner melts, and the toner image is fixed on the sheet.

The pair of discharge rollers 76 is provided on the downstream side of the fixing unit 7*d* in the sheet conveyance direction. At the time of printing, the control unit 4 rotates the pair of discharge rollers 76. The sheet that has passed through the pair of discharge rollers 76 is discharged to a discharge tray 711.

(First Control Circuit 1 and Second Control Circuit 2)

Next, an example of the first control circuit 1 and the second control circuit 2 according to the embodiment will be described with reference to FIG. 3. FIG. 3 is a diagram illustrating an example of the first control circuit 1 and the second control circuit 2 according to the embodiment.

Figure 3:
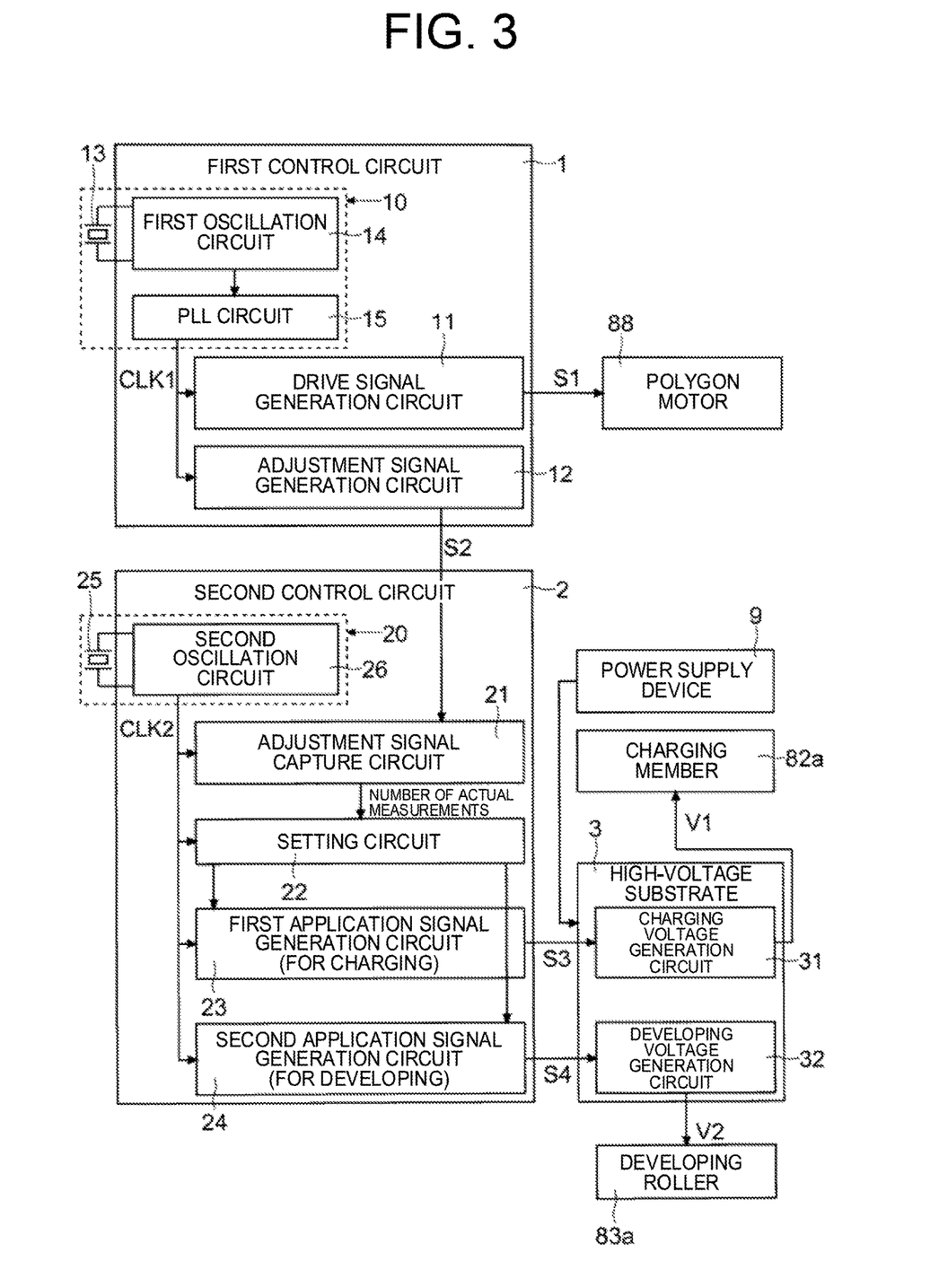
FIG. 3 is a diagram illustrating an example of a first control circuit and a second control circuit according to the embodiment.

As illustrated in FIG. 3, the printer 100 includes the first control circuit 1, the second control circuit 2, the high-voltage substrate 3, and a power supply device 9.

For example, the first control circuit 1 is an ASIC. The first control circuit 1 generates a motor drive signal S1. The motor drive signal S1 is a signal for rotating the polygon motor 88. For example, the polygon motor 88 is a direct current (DC) brushless motor. Further, the first control circuit 1 includes a first oscillation unit 10, a drive signal generation circuit 11, and an adjustment signal generation circuit 12.

The first oscillation unit 10 includes a first oscillator 13, a first oscillation circuit 14, and a phase locked loop (PLL) circuit 15. The first oscillator 13 is, for example, a crystal oscillator (quartz crystal oscillator). The first oscillation circuit 14 applies a voltage to the first oscillator 13 to vibrate the first oscillator 13. The first oscillation circuit 14 generates a clock signal based on the sine wave generated by the first oscillator 13. The first oscillation circuit 14 includes, for example, a NOT circuit, a plurality of capacitors, and a resistor. For example, the first oscillation circuit 14 outputs a clock signal of about 19 to 20 MHz.

The PLL circuit 15 outputs a first clock signal CLK1. The PLL circuit 15 outputs, as the first clock signal CLK1, a signal obtained by multiplying the clock signal output by the first oscillation circuit 14. For example, the PLL circuit 15 outputs the signal of about 400 to 500 MHz. When the clock signal output by the first oscillation circuit 14 is 20 MHz and the PLL circuit 15 multiplies the clock signal by 25 times, the PLL circuit 15 outputs the first clock signal CLK1 of 500 MHz.

The first clock signal CLK1 is used as a control clock signal for the first control circuit 1. The first clock signal CLK1 is also input to the drive signal generation circuit 11 and the adjustment signal generation circuit 12. Note that the first control circuit 1 may include a circuit other than the drive signal generation circuit 11 and the adjustment signal generation circuit 12. In this case, the first clock signal CLK1 is also supplied to the other circuits in the first control circuit 1.

The drive signal generation circuit 11 generates and outputs the motor drive signal S1. The drive signal generation circuit 11 is a counter (division circuit). The first clock signal CLK1 is input to the drive signal generation circuit 11. The drive signal generation circuit 11 counts the number of the first clock signal CLK1 which has been input. For example, the drive signal generation circuit 11 counts the number of times that the first clock signal CLK1 has risen or fallen.

Further, the drive signal generation circuit 11 changes the level of the motor drive signal S1 every time a count value of the first clock signal CLK1 reaches a first number of times. The drive signal generation circuit 11 sets the interval for counting the first clock signal CLK1 by the first number of times as one cycle of the motor drive signal S1. For example, when the count value reaches the first number of times, the drive signal generation circuit 11 changes (raises) the level of the motor drive signal S1 to the High level. When the count value reaches the first number of times, the drive signal generation circuit 11 resets the count value. The drive signal generation circuit 11 changes (falls down) the level of the motor drive signal S1 to the low level before the count value reaches the first number of times again.

The first number of times is predetermined (set in advance). The first number of times is determined, based on the ideal frequency (design frequency, frequency when there is no deviation) of the first clock signal CLK1. For example, it is assumed that the ideal frequency of the motor drive signal S1 (design frequency, frequency when there is no deviation) is 5000 Hz. It is assumed that the ideal frequency of the first clock signal CLK1 is 500 MHz. In this case, the first number of times is 500 MHz/5000 Hz=100,000.

The adjustment signal generation circuit 12 generates and outputs an adjustment signal S2. The adjustment signal generation circuit 12 is a counter (division circuit). The first clock signal CLK1 is input to the adjustment signal generation circuit 12. The adjustment signal generation circuit 12 counts the number of the first clock signal CLK1, which have been input. For example, the adjustment signal generation circuit 12 counts the number of times that the first clock signal CLK1 has risen or fallen.

The adjustment signal generation circuit 12 changes the level of the adjustment signal S2 every time the count value of the first clock signal CLK1 reaches a second number of times. The adjustment signal generation circuit 12 sets the interval for counting the first clock signal CLK1 by the second number of times as one cycle of the adjustment signal S2. For example, when the count value reaches the second number of times, the adjustment signal generation circuit 12 changes (raises) the level of the adjustment signal S2 to the High level. When the count value reaches the second number of times, the adjustment signal generation circuit 12 resets the count value. The adjustment signal generation circuit 12 changes (falls down) the level of the adjustment signal S2 to the Low level before the count value reaches the second number of times again.

The second number of times is predetermined (set in advance). The second number of times is determined, based on the ideal frequency (design frequency, frequency when there is no deviation) of the first clock signal CLK1. For example, it is assumed that the ideal frequency (design frequency, frequency when there is no deviation) of the adjustment signal S2 is 2 kHz. It is assumed that the ideal frequency of the first clock signal CLK1 is 500 MHz. In this case, the second number of times is 500 MHz/2 kHz=250,000.

For example, the second control circuit 2 is an ASIC. The second control circuit 2 is a circuit that generates a charging signal S3 and a developing signal S4 as application signals. The charging signal S3 is a signal used to apply a voltage to the charging member 82a (discharge wire). The developing signal S4 is a signal used to apply a voltage to the developing roller 83a. Specifically, the second control circuit 2 includes a second oscillation unit 20, an adjustment signal capture circuit 21, a setting circuit 22, a first application signal generation circuit 23, and a second application signal generation circuit 24.

The second oscillation unit 20 includes a second oscillator 25 and a second oscillation circuit 26. The second oscillator 25 is, for example, a crystal oscillator (quartz crystal oscillator). The second oscillation circuit 26 applies a voltage to the second oscillator 25 to vibrate the second oscillator 25. The second oscillation circuit 26 generates and outputs the second clock signal CLK2 based on the sine wave generated by the second oscillator 25. The second oscillation circuit 26 includes, for example, a NOT circuit, a plurality of capacitors, and a resistor. For example, the second oscillation circuit 26 outputs a clock signal of about 19 to 20 MHz.

The adjustment signal capture circuit 21 is a counter (division circuit). The adjustment signal S2 and the second clock signal CLK2 are input to the adjustment signal capture circuit 21. The adjustment signal capture circuit 21 counts the number of actual measurements. The number of actual measurements is a count value of the second clock signal CLK2 during one cycle of the input adjustment signal S2. For example, the adjustment signal capture circuit 21 counts the number of times that the second clock signal CLK2 has risen or fallen during one cycle of the adjustment signal S2. In other words, the adjustment signal capture circuit 21 counts the number of the second clock signal CLK2, which have been input during the period from the rising of the adjustment signal S2 to the rising of the next adjustment signal S2. Note that the theoretical number of times is predetermined for the number of actual measurements. The details of the theoretical number of times will be described later.

The setting circuit 22 sets a first set value for the first application signal generation circuit 23 and a second set value for the second application signal generation circuit 24 (the details will be described later).

The first application signal generation circuit 23 generates and outputs the charging signal S3. The first application signal generation circuit 23 is a counter (division circuit). The second clock signal CLK2 is input to the first application signal generation circuit 23. The first application signal generation circuit 23 counts the number of second clock signal CLK2 which has been input. For example, the first application signal generation circuit 23 counts the number of times that the second clock signal CLK2 has risen or fallen.

The first application signal generation circuit 23 changes the level of the charging signal S3 every time the count value of the second clock signal CLK2 reaches the first set value. The first application signal generation circuit 23 sets the interval for counting the second clock signal CLK2 by the first set value as one cycle of the charging signal S3. When the count value reaches the first set value, the first application signal generation circuit 23 changes (raises) the level of the charging signal S3 to the High level. When the count value reaches the first set value, the first application signal generation circuit 23 resets the count value. The first application signal generation circuit 23 changes (falls down) the level of the charging signal S3 to the Low level before the count value reaches the first set value again.

A charging reference value is set in advance for the first set value. The charging reference value is a theoretical value of the first set value. The charging reference value is determined, based on the ideal frequency (design frequency, frequency when there is no deviation) of the second clock signal CLK2. For example, it is assumed that the ideal frequency (design frequency, frequency when there is no deviation) of the charging signal S3 is 4 kHz. It is assumed that the ideal frequency of the second clock signal CLK2 is 20 MHz. In this case, the charging reference value is 20 MHz/4 kHz=5000.

The second application signal generation circuit 24 generates and outputs the developing signal S4. The developing signal S4 is used to apply a voltage to the developing roller 83a in the developing device 83. The second application signal generation circuit 24 is a counter (division circuit). The second clock signal CLK2 is input to the second application signal generation circuit 24. The second application signal generation circuit 24 counts the number of second clock signal CLK2 which has been input. For example, the second application signal generation circuit 24 counts the number of times that the second clock signal CLK2 has risen or fallen.

Further, the second application signal generation circuit 24 changes the level of the developing signal S4 every time the count value of the second clock signal CLK2 reaches the second set value. The second application signal generation circuit 24 sets the interval for counting the second clock signal CLK2 by the second set value as one cycle of the developing signal S4. When the count value reaches the second set value, the second application signal generation circuit 24 changes (raises) the level of the developing signal S4 to the High level. When the count value reaches the second set value, the second application signal generation circuit 24 resets the count value. Further, the second application signal generation circuit 24 changes (falls down) the level of the developing signal S4 to the Low level before the count value reaches the second set value again.

A developing reference value is set in advance for the second set value. The developing reference value is a theoretical value of the second set value. The developing reference value is determined, based on the ideal frequency of the second clock signal CLK2. For example, it is assumed that the ideal frequency (design frequency, frequency when there is no deviation) of the developing signal S4 is 8 kHz. It is assumed that the ideal frequency of the second clock signal CLK2 is 20 MHz. In this case, the developing reference value is 20 MHz/8 kHz=2500.

The high-voltage substrate 3 includes a charging voltage generation circuit 31 and a developing voltage generation circuit 32. The high-voltage substrate 3 receives electric power from the power supply device 9. At the time of printing, the control unit 4 causes the charging voltage generation circuit 31 to generate a voltage (charging voltage V1) to be applied to the charging member 82a (discharge wire). For example, the charging voltage generation circuit 31 includes a voltage booster circuit. For example, the peak-to-peak voltage of the charging voltage V1 is several kV. Note that the charging voltage V1 may be a voltage obtained by superimposing the DC voltage and the alternating current (AC) voltage on each other. Further, the charging voltage V1 may be the DC voltage.

The charging voltage generation circuit 31 applies the charging voltage V1 to the charging member 82a, based on the charging signal S3. For example, the charging voltage generation circuit 31 switches ON/OFF for the charging voltage V1 in accordance with High and Low of the charging signal S3. For example, when the charging signal S3 is at the High level, the charging voltage generation circuit 31 applies the charging voltage V1 to the charging member 82a. When the charging signal S3 is at the Low level, the charging voltage generation circuit 31 does not apply the charging voltage V1 to the charging member 82a.

Further, at the time of printing, the control unit 4 causes the developing voltage generation circuit 32 to generate a developing voltage V2. For example, the developing voltage generation circuit 32 includes a voltage boosting circuit. The developing voltage V2 is a voltage obtained by superimposing the DC voltage and the AC voltage on each other. The developing voltage generation circuit 32 generates a DC voltage to be applied to the developing roller 83a. The developing voltage generation circuit 32 biases the developing roller 83a with the DC voltage. Further, the developing voltage generation circuit 32 generates an AC voltage to be applied to the developing roller 83a. For example, the peak-to-peak voltage of the AC voltage is several kV. Further, the developing voltage generation circuit 32 applies the AC voltage to the developing roller 83a, based on the developing signal S4. For example, the developing voltage generation circuit 32 applies the AC voltage having the same frequency as the frequency of the developing signal S4 to the developing roller 83a.

(Setting of First Set Value and Second Set Value)

Figure 4:
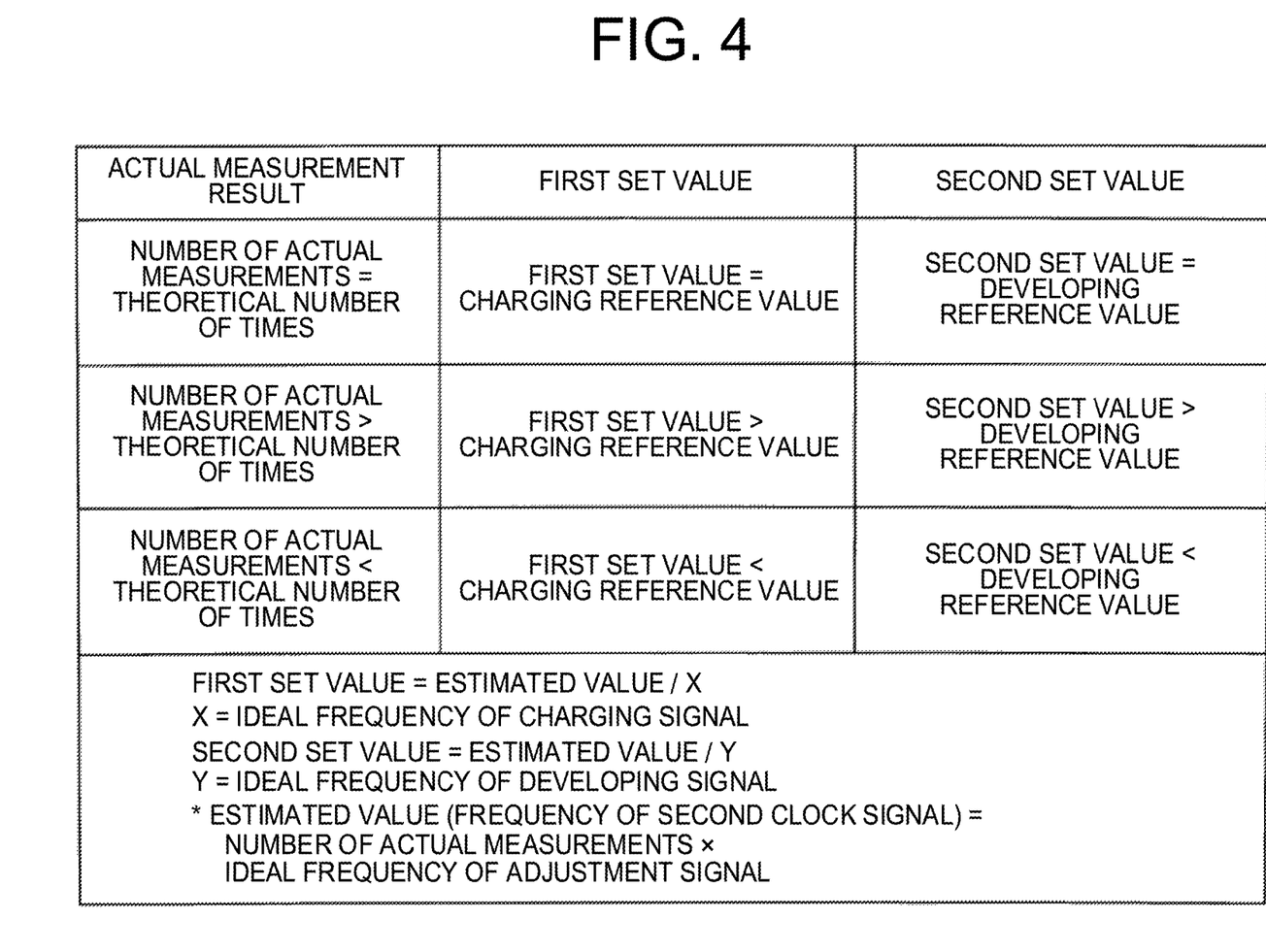
FIG. 4 is a diagram illustrating an example of setting a charging set value and a development set value according to the embodiment.

Next, an example of setting the first set value and the second set value according to the embodiment will be described with reference to FIG. 4. FIG. 4 is a diagram illustrating an example of setting the first set value and the second set value according to the embodiment.

Striped shading may appear on a printed matter, depending on the combination of the frequencies of the motor drive signal S1 and the charging signal S3. A phenomenon in which striped shading occurs may be referred to as frequency interference. Further, even between the charging signal S3 (charging voltage V1) and the developing signal S4 (developing voltage V2), striped shading may appear depending on the combination of the frequencies of the signals S3 and S4. Even between the motor drive signal S1 and the developing signal S4 (developing voltage V2), striped shading may appear depending on the combination of frequencies of the signals S1 and S4. As the ideal (design) frequencies of the charging signal S3 and the developing signal S4, frequencies at which the frequency interference does not occur are selected.

A charging reference value (theoretical value of the first set value) is predetermined. The charging reference value is a first set value at which frequency interference due to the charging voltage V1 does not occur when there is no frequency deviation between the first clock signal CLK1 and the second clock signal CLK2. Further, a developing reference value (theoretical value of the second set value) is also predetermined. The developing reference value is a second set value at which frequency interference due to the developing voltage V2 does not occur when there is no frequency deviation between the first clock signal CLK1 and the second clock signal CLK2.

The actual frequencies of the first clock signal CLK1 and the second clock signal CLK2 may deviate from the ideal frequencies of those signals due to the influence of temperature and individual differences in the oscillators. The first control circuit 1 and the second control circuit 2 generate and output the signals by using different clock signals. One or both of the clock signals may deviate in a direction in which the frequency interference occurs.

Therefore, the setting circuit 22 in the second control circuit 2 adjusts the first set value and the second set value to maintain a state in which frequency interference does not occur, even if the frequency of each clock signal deviates from the ideal frequency. The setting circuit 22 is, for example, a controller circuit provided in the ASIC. For example, the setting circuit 22 may set the first set value and the second set value at the time when the main power supply of the printer 100 is turned on. Further, at the time of starting a print job, the setting circuit 22 may set the first set value and the second set value. In this case, the setting circuit 22 sets each of the set values for each print job. The setting circuit 22 may set each of the set values for each printing of one page.

When the main power is turned on and the normal mode is returned from the sleep mode, power is supplied to the first control circuit 1 and the second control circuit 2. The first control circuit 1 and the second control circuit 2 operate by the power supply. During this operation, the first control circuit 1 generates the first clock signal CLK1 and the adjustment signal S2. Further, during the operation, the second control circuit 2 generates the second clock signal CLK2, and the adjustment signal capture circuit 21 counts.

When the setting circuit 22 sets the first set value and the second set value, the second control circuit 2 (the adjustment signal capture circuit 21) counts the number of actual measurements. The adjustment signal capture circuit 21 notifies the setting circuit 22 of the number of actual measurements. The setting circuit 22 recognizes the number of actual measurements. The setting circuit 22 may obtain an average value of the number of actual measurements for a plurality of times (a plurality of cycles) as the number of actual measurements.

Here, the theoretical number of times is predetermined for the number of actual measurements. The theoretical number of times is an ideal number of actual measurements. Specifically, the theoretical number of times is the number of actual measurements obtained when both the frequency of the first clock signal CLK1 and the frequency of the second clock signal CLK2 are the ideal frequencies (design frequency, frequency when there is no deviation). The theoretical number of times is a number obtained by dividing the ideal frequency of the second clock signal CLK2 by the ideal frequency of the adjustment signal S2.

1. When the Number of Actual Measurements=the Theoretical Number of Times

When the number of actual measurements is the same as the theoretical number of times, it is recognized that there is no frequency deviation in the first clock signal CLK1 and the second clock signal CLK2. When the set value is set as designed, the striped shading due to the frequency interference does not appear.

In this case, the setting circuit 22 sets the charging reference value as the first set value in the first application signal generation circuit 23. The first application signal generation circuit 23 sets the cycle of the charging signal S3 as a period for counting the second clock signal CLK2 by the charging reference value. Further, the setting circuit 22 sets the developing reference value as the second set value in the second application signal generation circuit 24. The second application signal generation circuit 24 sets the cycle of the developing signal S4 as a period for counting the second clock signal CLK2 by the developing reference value.

2. When the Number of Actual Measurements>the Theoretical Number of Times (when the Number of Actual Measurements is Larger)

When the number of actual measurements is larger than the theoretical number of times, there is a frequency deviation in either or both of the first clock signal CLK1 and the second clock signal CLK2. It is necessary to adjust the first set value and the second set value.

In this case, the setting circuit 22 sets a value larger than the charging reference value as the first set value. The setting circuit 22 sets the first set value larger than the reference in the first application signal generation circuit 23. Then, the setting circuit 22 sets the first set value to a larger value as the absolute value of the difference of the number of actual measurements and the theoretical number of times is larger. Further, the setting circuit 22 sets a value larger than the developing reference value as the second set value. The setting circuit 22 sets the second set value larger than the reference in the second application signal generation circuit 24. Then, the setting circuit 22 increases the second set value as the absolute value of the difference of the number of actual measurements and the theoretical number of times is larger.

When the number of actual measurements is larger than the theoretical number of times, there is a possibility that the frequency of the first clock signal CLK1 is deviated in a direction lower than the ideal. When the frequency of the first clock signal CLK1 is low, the frequency of the adjustment signal S2 decreases. For example, it is assumed that the ideal frequency of the adjustment signal S2 is 2 kHz. The adjustment signal S2 is less than 2 kHz. In this case, one cycle of the adjustment signal S2 becomes longer than the ideal. As one cycle of the adjustment signal S2 is longer, the number of actual measurements increases.

When the frequency of the first clock signal CLK1 is lower than the ideal, the frequency of the motor drive signal S1 decreases. Therefore, when the number of actual measurements is larger than the theoretical number of times, the first set value is set to be larger than the charging reference value. Accordingly, it is possible to decrease the frequency of the charging signal S3 (lengthen the cycle) in accordance with the motor drive signal S1. When the number of actual measurements is larger than the theoretical number of times, the second set value is set to be larger than the developing reference value. Accordingly, it is possible to decrease the frequency of the developing signal S4 in accordance with the motor drive signal S1 and the charging signal S3.

If the number of actual measurements is larger than the theoretical number of times, there is a possibility that the frequency of the second clock signal CLK2 is deviated in a direction higher than the ideal (design). When the frequency of the second clock signal CLK2 is high, the number of actual measurements becomes larger than the theoretical number of times. Even if the frequency of the second clock signal CLK2 is higher than the ideal, it is necessary to prevent the frequency of the charging signal S3 from excessively increasing. When the number of actual measurements is larger than the theoretical number of times, the first set value is set to be larger than the charging reference value. Even if the frequency of the second clock signal CLK2 is higher than the ideal, the first set value is automatically increased. It is possible to suppress an increase in the frequency of the charging signal S3.

Further, even if the frequency of the second clock signal CLK2 is higher than the ideal, it is necessary to prevent the frequency of the developing signal S4 from excessively increasing. When the number of actual measurements is larger than the theoretical number of times, the second set value is set to be larger than the developing reference value. Accordingly, even if the frequency of the second clock signal CLK2 is higher than the ideal, the second set value is automatically increased. It is possible to suppress an increase in the frequency of the developing signal S4.

3. When the Number of Actual Measurements<Theoretical Number of Times (when the Number of Actual Measurements is Smaller)

When the number of actual measurements is smaller than the theoretical number of times, there is a frequency deviation in either or both of the first clock signal CLK1 and the second clock signal CLK2. It is necessary to adjust the first set value and the second set value.

In this case, the setting circuit 22 sets a value smaller than the charging reference value as the first set value. The setting circuit 22 sets the first set value smaller than the reference in the first application signal generation circuit 23. The setting circuit 22 reduces the first set value as the absolute value of the difference of the number of actual measurements and the theoretical number of times is larger. Further, the setting circuit 22 sets a value smaller than the developing reference value as the second set value. The setting circuit 22 sets the second set value smaller than the reference in the second application signal generation circuit 24. The setting circuit 22 reduces the second set value as the absolute value of the difference of the number of actual measurements and the theoretical number of times is larger.

If the number of actual measurements is smaller than the theoretical number of times, there is a possibility that the frequency of the first clock signal CLK1 is deviated in a direction higher than the ideal. When the frequency of the first clock signal CLK1 is high, the frequency of the adjustment signal S2 increases. For example, it is assumed that the ideal frequency of the adjustment signal S2 is 2 kHz. The adjustment signal S2 is more than 2 kHz. One cycle of the adjustment signal S2 becomes shorter than the ideal. As one cycle of the adjustment signal S2 is shorter, the number of actual measurements is reduced.

When the frequency of the first clock signal CLK1 is higher than the ideal, the frequency of the motor drive signal S1 becomes higher, and the cycle becomes shorter. When the number of actual measurements is smaller than the theoretical number of times, the setting circuit 22 sets the first set value to be smaller than the charging reference value.

Accordingly, it is possible to increase the frequency of the charging signal S3 (shorten the cycle) in accordance with the motor drive signal S1. When the number of actual measurements is smaller than the theoretical number of times, the setting circuit 22 sets the second set value to be smaller than the developing reference value. Accordingly, it is possible to increase the frequency of the developing signal S4 (shorten the cycle) in accordance with the motor drive signal S1 and the charging signal S3.

If the number of actual measurements is smaller than the theoretical number of times, there is a possibility that the frequency of the second clock signal CLK2 is deviated in a direction lower than the ideal. When the frequency of the second clock signal CLK2 is low, the number of actual measurements is smaller than the theoretical number of times.

Even if the frequency of the second clock signal CLK2 is lower than the ideal, it is necessary to prevent the frequency of the charging signal S3 from excessively decreasing. When the number of actual measurements is smaller than the theoretical number of times, the setting circuit 22 sets the first set value to be smaller than the charging reference value. The first set value is automatically reduced. It is possible to suppress a decrease in the frequency of the charging signal S3. Further, it is also necessary to prevent the frequency of the developing signal S4 from excessively decreasing. When the number of actual measurements is smaller than the theoretical number of times, the setting circuit 22 sets the second set value to be smaller than the developing reference value. Accordingly, the second set value is automatically reduced. It is possible to suppress a decrease in the frequency of the developing signal S4.

As described above, even if the frequency of the second clock signal CLK2 is deviated, it is possible to maintain the frequencies of the charging signal S3 and the developing signal S4. Further, even if the frequency of the motor drive signal S1 shifts due to the deviation of the frequency of the first clock signal CLK1, it is possible to shift the frequencies of the charging signal S3 and the developing signal S4 in the same direction.

Next, a method for obtaining a specific set value will be described. The setting circuit 22 obtains an estimated value of the frequency of the second clock signal CLK2. Specifically, the setting circuit 22 obtains a value obtained by multiplying the number of actual measurements by the ideal frequency (frequency when there is no deviation) of the adjustment signal S2 as the estimated value. For example, it is assumed that the ideal frequency of the adjustment signal S2 is 2 kHz. It is assumed that the number of actual measurements is 10,040. The setting circuit 22 obtains 20.08 MHz as the estimated value of the frequency of the second clock signal CLK2, based on the calculation of 10,040 multiplied by 2000.

Then, the setting circuit 22 determines the first set value on the basis of the obtained estimated value. Specifically, the setting circuit 22 sets a value obtained by dividing the estimated value by the ideal frequency (design frequency, frequency when there is no deviation) of the charging signal S3 as the first set value. For example, the ideal frequency of the charging signal S3 is assumed to 4 kHz. The calculated estimated value is assumed to be 20.08 MHz. In this case, the setting circuit 22 sets 20,080,000/4000=5020 as the first set value.

Further, the setting circuit 22 determines the second set value based on the obtained estimated value. Specifically, the setting circuit 22 sets a value obtained by dividing the estimated value by the ideal frequency (design frequency, frequency when there is no deviation) of the developing signal S4 as the second set value. For example, the ideal frequency of the developing signal S4 is assumed to 8 kHz. The obtained estimated value is assumed to be 20.08 MHz. In this case, the setting circuit 22 sets 20,080,000/8000=2510 as the second set value.

As described in the above, the image forming device (printer 100) according to the embodiment includes the first control circuit 1, the second control circuit 2, the high-voltage substrate 3, and the polygon motor 88. The high-voltage substrate 3 receives the application signal output from the second control circuit 2. The high-voltage substrate 3 applies a voltage having the frequency of the input application signal to the toner image forming member. The first control circuit 1 includes the first oscillation unit 10, the drive signal generation circuit 11, and the adjustment signal generation circuit 12. The first oscillation unit 10 generates the first clock signal CLK1 by using the first oscillator 13. The drive signal generation circuit 11 counts the number of the first clock signals CLK1, which have been input. The drive signal generation circuit 11 generates the motor drive signal S1. The drive signal generation circuit 11 sets the interval for counting the first clock signal CLK1 by the first number of times as one cycle of the motor drive signal S1. The drive signal generation circuit 11 rotates the polygon motor 88 by inputting the motor drive signal S1 to the polygon motor 88. The adjustment signal generation circuit 12 counts the number of the first clock signal CLK1, which have been input. The adjustment signal generation circuit 12 generates the adjustment signal S2. The adjustment signal generation circuit 12 sets the interval for counting the first clock signal CLK1 by the second number of times as one cycle of the adjustment signal S2. The second control circuit 2 includes the second oscillation unit 20, the adjustment signal capture circuit 21, the application signal generation circuit, and the setting circuit 22. The second oscillation unit 20 generates the second clock signal CLK2 by using the second oscillator 25. The adjustment signal capture circuit 21 counts the number of actual measurements which is the count value of the second clock signal CLK2 during one cycle of the adjustment signal S2, which have been input. The application signal generation circuit counts the number of the second clock signal CLK2, which have been input. The application signal generation circuit sets the interval for counting the second clock signal CLK2 by the set value as one cycle of the application signal. The setting circuit 22 compares the number of actual measurements with the predetermined theoretical number of times of the number of actual measurements. The setting circuit 22 sets the set value in accordance with the difference between the number of actual measurements and the theoretical number of times. The theoretical number of times is the number obtained by dividing the ideal frequency of the second clock signal CLK2 by the ideal frequency of the adjustment signal S2.

It is possible to count the adjustment signal S2 based on the first clock signal CLK1 by using the second clock signal CLK2. It is possible to recognize how to adjust the application signal, based on the deviation between the number of actual measurements (count value based on the second clock signal CLK2) and the theoretical number of times. It is possible to adjust the set value, based on the recognized deviation. It is possible to adjust the frequency of the application signal so that no frequency interference occurs. It is possible to automatically adjust the frequency of the application signal so that the image quality does not deteriorate due to the frequency interference.

When the number of actual measurements is the same as the theoretical number of times, the setting circuit 22 sets the set value to the predetermined reference value. When the number of actual measurements is larger than the theoretical number of times, the setting circuit 22 sets the set value to a value larger than the reference value. The setting circuit 22 increases the set value as the absolute value of the difference between the number of actual measurements and the theoretical number of times is larger. When the actual frequency of the second clock signal CLK2 is higher than the ideal frequency (design frequency) of the second clock signal CLK2, the number of actual measurements becomes larger than the theoretical number of times. In this case, the set value is adjusted to be large. This adjustment allows to suppress an increase in the frequency of the application signal.

Further, when the actual frequency of the first clock signal CLK1 becomes lower than the ideal frequency (design frequency), the frequency of the adjustment signal S2 decreases, and the cycle becomes longer. Also in this case, the number of actual measurements is larger than the theoretical number of times. In this case, the frequency of the motor drive signal S1 also tends to decrease. On the other hand, a set value larger than the reference is set. It is possible to decrease the frequency of the application signal in accordance with the decrease in the frequency of the motor drive signal S1.

When the number of actual measurements is smaller than the theoretical number of times, the setting circuit 22 sets the set value to a value smaller than the reference value. The setting circuit 22 sets the set value to be smaller as the absolute value of the difference between the number of actual measurements and the theoretical number of times is larger. When the actual frequency of the second clock signal CLK2 is lower than the ideal frequency (design frequency) of the second clock signal CLK2, the number of actual measurements becomes smaller than the theoretical number of times. In this case, the set value is adjusted to be small. This adjustment allows to prevent the frequency of the application signal from decreasing.

Further, when the actual frequency of the first clock signal CLK1 becomes higher than the ideal frequency (design frequency), the cycle of the adjustment signal S2 becomes shorter. Also in this case, the number of actual measurements is smaller than the theoretical number of times. In this case, the cycle of the motor drive signal S1 becomes short. The set value is set to a small value. It is possible to increase the frequency of the application signal in accordance with the increase in the frequency of the motor drive signal S1.

The setting circuit 22 obtains the estimated value of the frequency of the second clock signal CLK2 by multiplying the number of actual measurements by the ideal frequency of the adjustment signal S2. The setting circuit 22 sets the value obtained by dividing the obtained estimated value by the ideal frequency of the application signal as the set value. It is possible to calculate the set value. It is possible to easily set the value (set value) for setting the frequency of the application signal so that no frequency interference occurs.

The first oscillation unit 10 includes the oscillation circuit and the PLL circuit 15. The PLL circuit 15 outputs, as the first clock signal CLK1, the signal obtained by multiplying the signal output by the oscillation circuit. It is possible to generate the first clock signal CLK1 by using the PLL circuit 15. It is possible to automatically adjust the frequency of the application signal according to the actual frequency of the first clock signal CLK1 so that the image quality does not deteriorate.

The toner image forming member is the member for charging the photosensitive drum 80. It is possible to prevent the occurrence of image quality deterioration (frequency interference) caused by the relationship between the frequency of the charging voltage V1 and the frequency of the motor drive signal S1.

The toner image forming member is the developing roller 83a that supplies toner to the photosensitive drum 80 to develop an electrostatic latent image. It is possible to prevent the occurrence of image quality deterioration (frequency interference) caused by the relationship between the frequency of the developing voltage V2 and the frequency of the motor drive signal S1.

Although the embodiments of the present disclosure have been described, the scope of the present disclosure is not limited thereto, and various modifications can be made without departing from the spirit of the disclosure.

The present disclosure can be used in an image forming device that prints using toner.

What is claimed is:

1. An image forming device comprising:
    a first control circuit;
    a second control circuit;
    a high-voltage substrate; and
    a polygon motor,
    wherein the high-voltage substrate receives an application signal output from the second control circuit, and applies a voltage with a frequency of the application signal which has been input, to a toner image forming member;
    wherein the first control circuit comprises a first oscillation unit, a drive signal generation circuit, and an adjustment signal generation circuit;
    wherein the first oscillation unit generates a first clock signal by using a first oscillator;
    wherein the drive signal generation circuit counts the number of the first clock signal which has been input, generates a motor drive signal, sets an interval for counting the first clock signal by a first number of times as one cycle of the motor drive signal, and inputs the motor drive signal to the polygon motor to rotate the polygon motor;
    wherein the adjustment signal generation circuit counts the number of the first clock signal which has been input, generates an adjustment signal, and sets an interval for counting the first clock signal by a second number of times as one cycle of the adjustment signal;
    wherein the second control circuit comprises a second oscillation unit, an adjustment signal capture circuit, an application signal generation circuit, and a setting circuit;
    wherein the second oscillation unit generates a second clock signal by using a second oscillator;
    wherein the adjustment signal capture circuit counts the number of actual measurements, which is a count value of the second clock signal during one cycle of the adjustment signal which has been input;
    wherein the application signal generation circuit counts the number of the second clock signal which has been input, and sets an interval for counting the second clock signal by a set value as one cycle of the application signal;
    wherein the setting circuit compares the number of actual measurements with a predetermined theoretical number of times for the number of actual measurements, and sets the set value in accordance with a difference between the number of actual measurements and the theoretical number of times; and wherein the theoretical number of times is a number obtained by dividing an ideal frequency of the second clock signal by an ideal frequency of the adjustment signal.

2. The image forming device according to claim 1, wherein the setting circuit sets the set value to a predetermined reference number of times when the number of actual measurements is the same as the theoretical number of times, sets the set value to a value larger than the reference number of times when the number of actual measurements is larger than the theoretical number of times, and increases the set value as an absolute value of a difference between the number of actual measurements and the theoretical number of times is larger.

3. The image forming device according to claim 2, wherein the setting circuit sets the set value a value smaller than the reference number of times when the number of actual measurements is smaller than the theoretical number of times, and decreases the set value as an absolute value of a difference between the number of actual measurements and the theoretical number of times is larger.

4. The image forming device according to claim 1, wherein the setting circuit obtains an estimated value of a frequency of the second clock signal by multiplying the number of actual measurements by an ideal frequency of the adjustment signal, and sets a value obtained by dividing the obtained estimated value by an ideal frequency of the application signal as the set value.

5. The image forming device according to claim 1, wherein the first oscillation unit comprises an oscillation circuit and a phase locked loop (PLL) circuit, and wherein the PLL circuit outputs, as the first clock signal, a signal obtained by multiplying a signal output from the oscillation circuit.

6. The image forming device according to claim 1, wherein the toner image forming member is a member for charging a photosensitive drum.

7. The image forming device according to claim 1, wherein the toner image forming member is a developing roller that supplies toner to a photosensitive drum to develop an electrostatic latent image.

\* \* \* \* \*